(12) United States Patent
Smith

(10) Patent No.: US 12,342,563 B2
(45) Date of Patent: Jun. 24, 2025

(54) TRANSISTOR WITH GATE ATTACHED FIELD PLATE

(71) Applicant: Micron Technology, Inc., Boise, ID (US)

(72) Inventor: Michael A. Smith, Boise, ID (US)

(73) Assignee: Micron Technology, Inc., Boise, ID (US)

(*) Notice: Subject to any disclaimer, the term of this patent is extended or adjusted under 35 U.S.C. 154(b) by 455 days.

(21) Appl. No.: 17/752,610

(22) Filed: May 24, 2022

(65) Prior Publication Data
US 2023/0387258 A1    Nov. 30, 2023

(51) Int. Cl.
| H10D 30/01 | (2025.01) |
| H10D 30/60 | (2025.01) |
| H10D 64/00 | (2025.01) |
| H10D 64/27 | (2025.01) |

(52) U.S. Cl.
CPC ....... *H10D 30/0227* (2025.01); *H10D 30/601* (2025.01); *H10D 64/112* (2025.01); *H10D 64/512* (2025.01)

(58) Field of Classification Search
CPC ............... H01L 29/6659; H01L 29/404; H01L 29/42356; H01L 29/7833; H01L 29/0847; H01L 29/42368; H01L 29/4933; H10D 30/0227; H10D 30/601; H10D 64/112; H10D 64/512; H10D 62/151; H10D 64/516; H10D 64/663
See application file for complete search history.

(56) References Cited

U.S. PATENT DOCUMENTS

| 10,586,865 | B2* | 3/2020 | Warrick | H10D 64/111 |
| 10,886,418 | B2* | 1/2021 | Haynie | H10D 64/411 |
| 11,107,914 | B2* | 8/2021 | Xu | H10D 30/65 |
| 11,121,225 | B2* | 9/2021 | Ho | H10D 84/83 |
| 11,164,970 | B2* | 11/2021 | Ho | H10D 64/017 |
| 11,177,140 | B2* | 11/2021 | Or-Bach | H10D 89/10 |
| 11,563,117 | B1* | 1/2023 | Smith | H10D 84/038 |
| 2014/0246760 | A1* | 9/2014 | Strassburg | H01L 29/66431 257/637 |
| 2017/0207335 | A1* | 7/2017 | Lin | H01L 29/402 |
| 2021/0134964 | A1* | 5/2021 | Ho | H10D 30/603 |

* cited by examiner

*Primary Examiner* — Khaja Ahmad
*Assistant Examiner* — Khatib A Rahman
(74) *Attorney, Agent, or Firm* — Perkins Cole LLP

(57) ABSTRACT

An apparatus includes a substrate and a transistor disposed on the substrate. The transistor can include a gate disposed between a source area and a drain area of the transistor. The transistor can also include a plurality of routing lanes above the gate for use by automated routing programs that layout metal connections for the apparatus. A first field plate can be disposed above a LDD region of the source area with the first field plate being on a same level as the plurality of routing lanes. A second field plate can be disposed above a LDD region of the drain area with the second field plate being on the same level as the plurality of routing lanes. The first and second field plates can be electrically connected to the gate using respective first and second path that bypass the plurality of routing lanes.

19 Claims, 7 Drawing Sheets

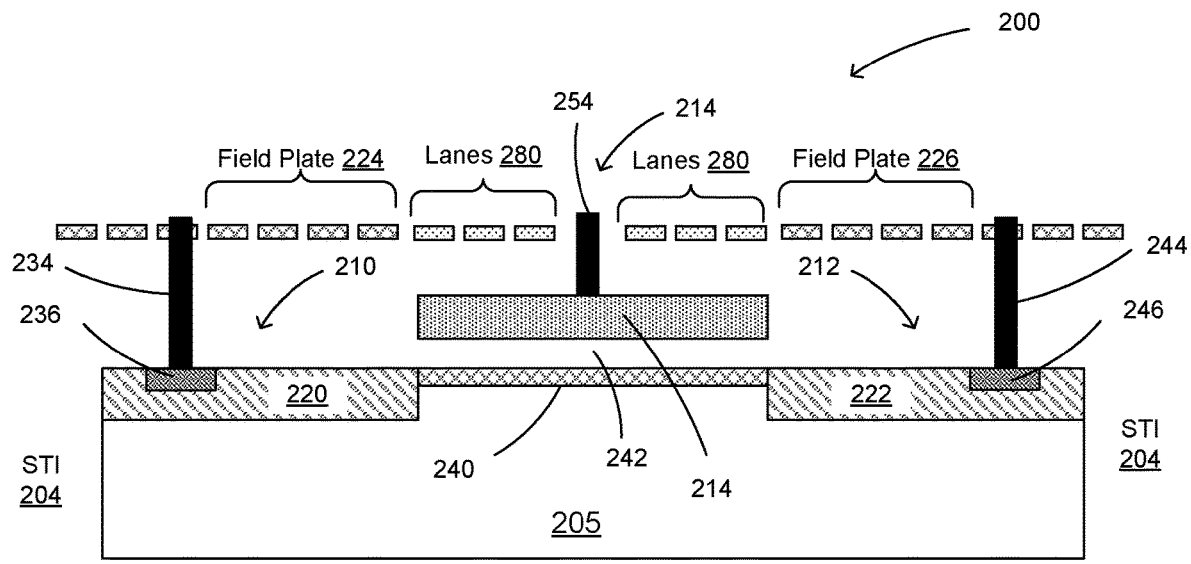
FIG. 2B
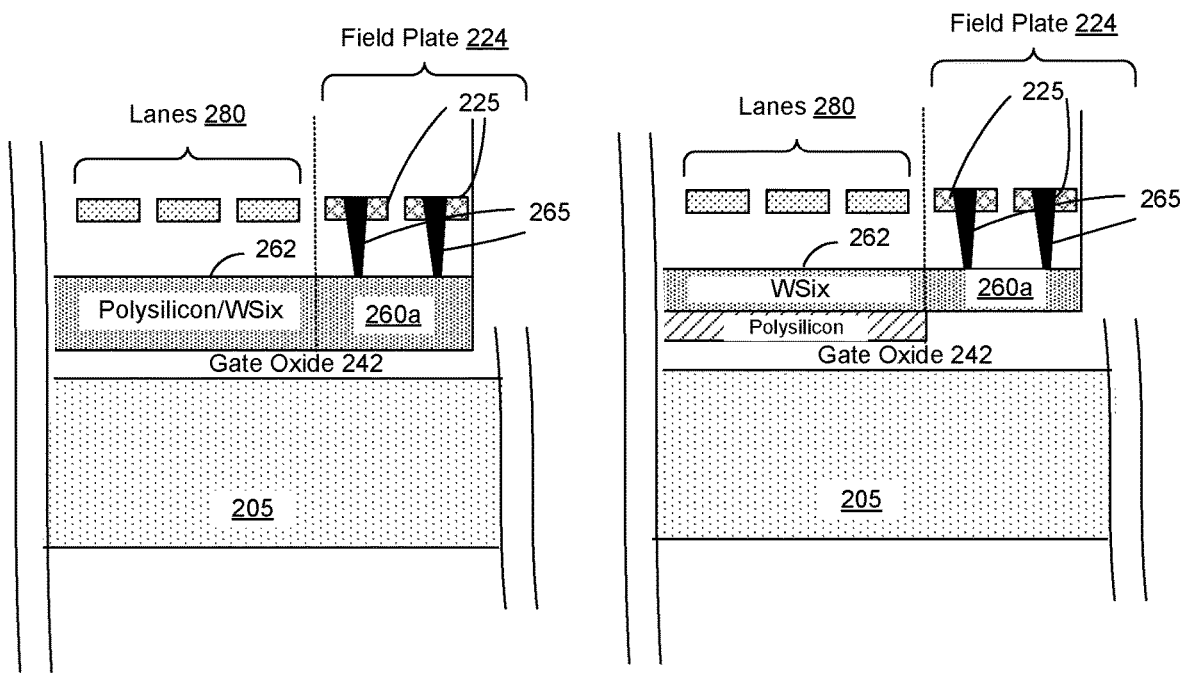
FIG. 2C   FIG. 2D

TRANSISTOR WITH GATE ATTACHED FIELD PLATE

TECHNICAL FIELD

The present disclosure generally relates to transistors, and more particularly, to a transistor with a gate attached field plate that preserves routing lanes.

BACKGROUND

Transistor devices, such as high voltage transistors, can include lightly doped regions with N− or P− implants (depending on the type of transistor). In some cases, the lightly doped regions ("LDD regions") can correspond to the contact-to-gate regions for the source and/or drain. The doping in the LDD regions helps the transistor withstand high voltages (e.g., 10-35 volts in memory devices or even higher voltages in power electronics). A device (e.g., memory devices and/or other types of transistor devices) may require different types of transistors to account for different voltage threshold (Vt) requirements and/or different channel widths, which can shift the required implant dose concentration range to a higher value, for example, as the channel narrows. That is, different transistors may require different implant dose concentrations to keep the respective breakdown voltages (BV) within acceptable ranges. In some cases, multiple implant dose steps will be required when a single implant dose concentration cannot keep the B V values of the different transistors within respective acceptable ranges. However, having multiple implant dose steps can mean that the efficiency of the fabrication process will be reduced and can increase the cost of the fabrication.

For the reasons stated above, and for other reasons stated below which will become apparent to those skilled in the art upon reading and understanding the present specification, there is a need in the art for limiting the number of different implant dose concentrations when fabricating a transistor device.

BRIEF DESCRIPTION OF THE DRAWINGS

FIGS. 2A and 2B illustrate a top view and a partial cross-sectional view of a GAFP transistor in accordance with the present disclosure.

FIG. 2C illustrates a partial cross-sectional view of another embodiment of a GAFP transistor in accordance with the present disclosure.

FIG. 2D illustrates a partial cross-sectional view of another embodiment of a GAFP transistor in accordance with the present disclosure.

DETAILED DESCRIPTION

Figure 1A:
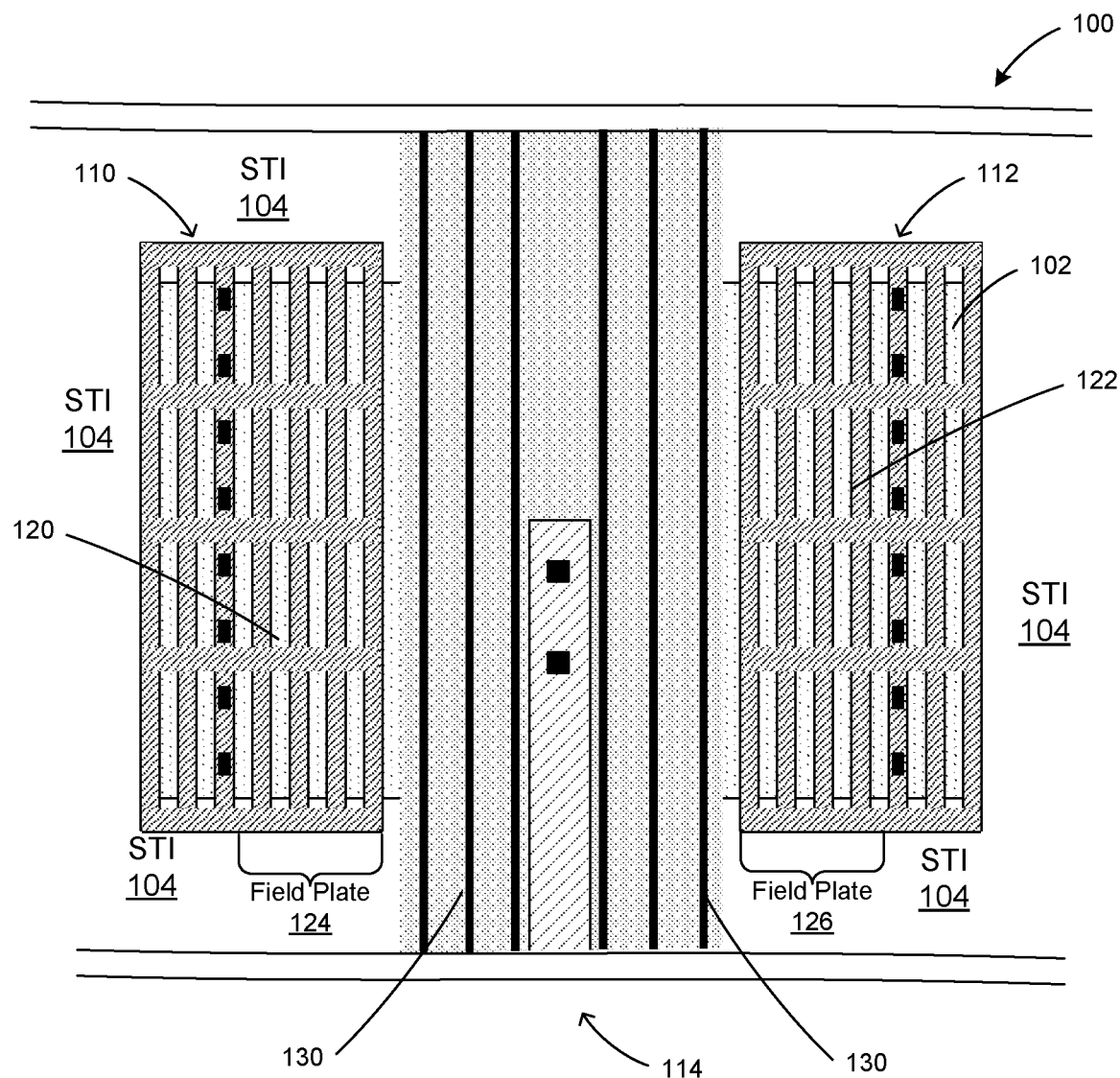
FIG. 1A illustrates a top plan view of a related art DAFP transistor.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense. Those skilled in that understand the details of a fabrication process for a memory device, including transistors, and thus, for brevity, details related to oxide layer deposition, metal layer deposition, photoresist layers, masks, chemical and/or plasma etching, dopant implant techniques and other known details are omitted in the following description.

A memory device can include a semiconductor substrate with one or more memory cell arrays and supporting logic circuits located on the peripheral area or region adjacent the memory cell arrays. The logic circuits can include, for example, control and addressing circuits, line driver circuits, sense amplifier circuits, and other supporting circuitry for operating and communicating with the memory cell arrays. The peripheral regions can also be used to separate the memory cell arrays from each other. Designing of the peripheral logic circuits is typically done automatically using programs having automatic place and route tools. Accordingly, to facilitate the automated design process, peripheral logic circuits can be comprised of parameterized cells (PCells) (e.g., standardized integrated circuits) that provide or can be interconnected to provide basic logic functions (e.g., AND, OR, XOR, XNOR, inverter, flipflop, latch, etc.). One or more metal connect lines (e.g., signal and/or power connection lines) can be disposed above the transistors and routed along one or more predetermined routing lanes that facilitate intra-cell and inter-cell connections for the PCells. The predetermined routing lanes for depositing the metal connections in each standardized cell can be in a grid pattern with rows and columns. Accordingly, the greater the number of predetermined routing lanes in each PCell, the more routing options that are available for the automatic place and route tools, which can relax the congestion routing for metal layers, for example.

Figure 1B:
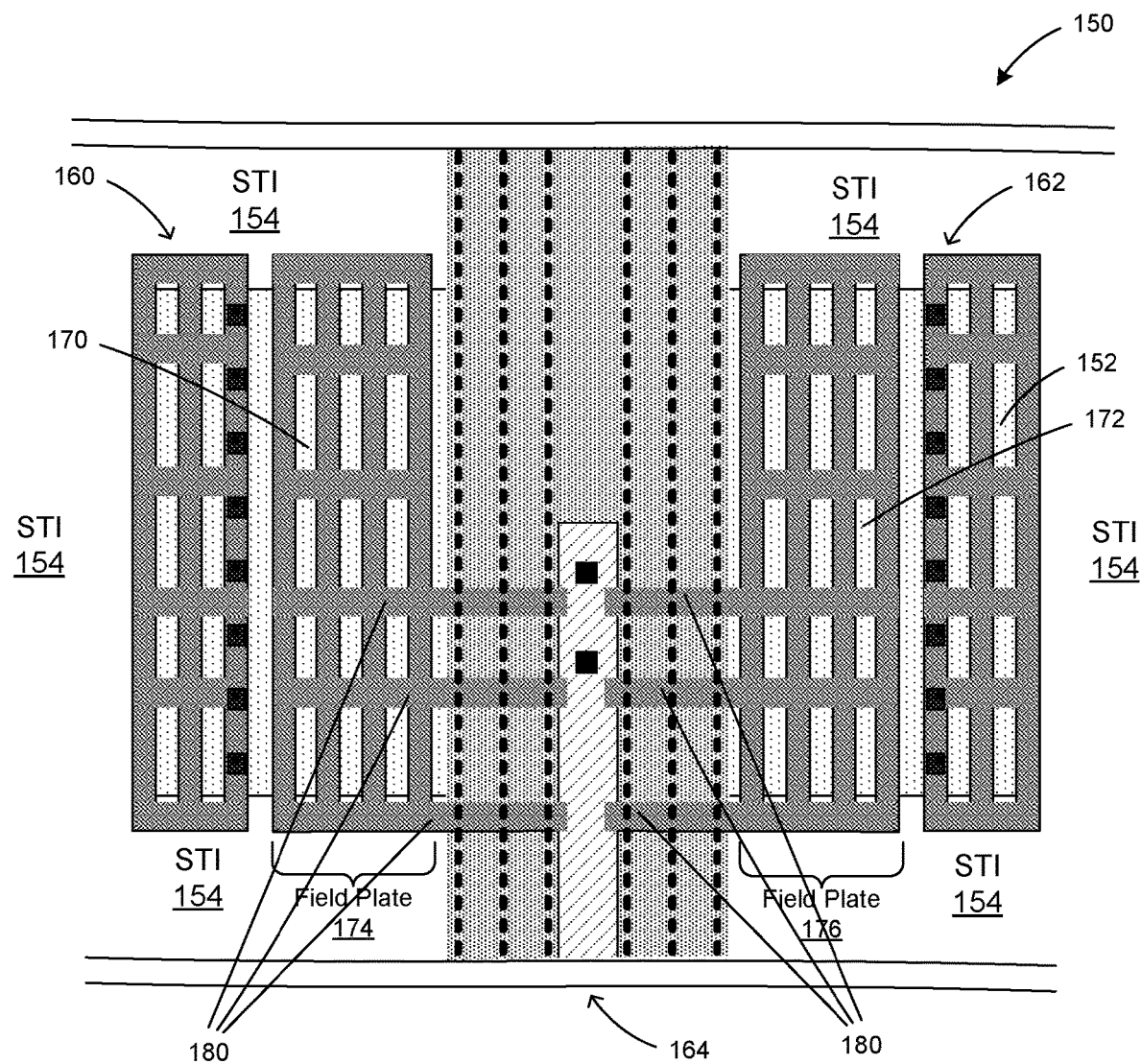
FIG. 1B illustrates a top plan view of a related art GAFP transistor.

Use of field plates may be desired in some transistors because the LDD region can be subject to coupling to overlying or nearby conductors. The field plate shields the underlying LDD region from parasitic coupling to the nearby conductors. The metal layer close to the silicon substrate that is used for the metal connect lines (e.g., the predetermined routing lanes used for PCell routing) can be utilized for creating field plates over transistors (e.g., high voltage N-channel FETs). This means that the metal routing lanes above the LDD region are no longer available for intra- and/or inter-PCell connections. The transistors can be configured as drain-attached field plate (DAFP) transistors or gate-attached field plate (GAFP) transistors. Those skilled in the art understand that the term "DAFP transistor" also applies to transistors that have a field plate connected to the source contact. FIGS. 1A and 1B respectively illustrate related art DAFP and GAFP transistors.

FIG. 1A shows simplified top view of a related art DAFP high-voltage transistor 100. The transistor 100 includes an active area 102 surrounded by a shallow-trench isolation (STI) 104 that can be composed of, for example, silicon dioxide. The transistor 100 includes a drain 110, a source 112, and a gate 114. The transistor 100 includes LDD region 120 that is formed between the contacts of drain 110 and the nearest edge of the gate 114. Similarly, the LDD region 122 is formed between the contacts of source 112 and the nearest edge of the gate 114. The field plate 124 can be formed in a metal layer above the drain 110 and can be connected to one or more of the drain contacts. The field plate 126 can be formed in a metal layer above the respective source 112 and can be connected to one or more of the source contacts. The transistor 100 can also include secondary field plates that are located over the contact-to-active area edge portions of the drain 110 and/or source 112 and connected to the respective contacts. As seen in FIG. 1A, although the field plates 124 and 126 occupy the metal layer used for the predetermined routing lanes above the drain and source, the predetermined routing lanes 130 above the gate 114 are still available for use by automated place and route tools for metal connections within the transistor 100 and/or between transistors and/or for manual layout (e.g., in NAND high voltage analog circuits).

FIG. 1B shows simplified top view of a related art GAFP high-voltage transistor 150. The transistor 150 includes an active area 152 surrounded by a shallow-trench isolation (STI) 154 that can be composed of, for example, silicon dioxide. The transistor 150 includes a drain 160, a source 162, and a gate 164. The transistor 150 includes LDD region 170 that is formed between the contacts of drain 160 and the nearest edge of the gate 164. Similarly, the LDD region 172 is formed between the contacts of source 162 and the nearest edge of the gate 164. The field plate 174 can be formed in a metal layer above the LDD region 170 and can be connected to the contacts of gate 164 using metal connection lines 180. The field plate 176 can be formed in a metal layer above the LDD region 172 and can be connected to one or more of the gate contacts using metal connection lines 180. The transistor 150 can also include secondary field plates that are located over the contact-to-active area edge portions of the drain 160 and/or source 162 and connected to the respective contacts. As seen in FIG. 1B, unlike the DAFP transistor 100, due to the metal connection lines 180 to the gate 164, there are no available routing lanes for the metal connections above transistor 150, including above the gate 164 (shown dotted to indicate unavailability), that can be used by automated place and routing programs for connections within the transistor and/or between transistors.

Accordingly, in related art systems, DAFP transistors are generally preferred because, unlike the related art GAFP transistors, routing lanes for the PCells are still available over the gate region of DAFP transistors even though the routing lanes in the LDD regions are taken up by the field plate. However, in some scenarios, the use of GAFP transistors can reduce the number of implant dose steps required for fabricating the memory device (and/or another electronic device) in comparison to using just DAFP transistors. For example, in some situations, a single implant dose step cannot satisfy the BV requirements of two different DAFP transistors because the two transistors require different dose concentrations in the LDD region. In such situations, the DAFP transistor requiring the lower dose concentration in the LDD region can sometimes be substituted with a GAFP transistor having similar characteristics (e.g., similar BV value). This is because, in general, although the actual implanted and activated dopant concentration is the same, the effective implant dose concentration in the LDD region of a GAFP transistor after taking into consideration all electrical effects, such as accumulation or depletion from nearby conductors or from internal p-n junction depletion, will be less than that for a DAFP transistor for a same applied implant dose concentration. As used herein, "applied implant dose concentration" or "applied dose" means a dopant concentration applied during a dopant implant step. Accordingly, because a GAFP transistor has a lower effective implant dose concentration than a DAFP transistor for a given applied dose, in some situations, a DAFP transistor that requires a lower applied implant dose concentration can be substituted with an appropriate GAFP transistor so that a same applied dose can used in the fabrication of a DAFP transistor and a GAFP transistor.

However, because the routing lanes for metal connections over both the LDD regions and over the gate region will be unavailable in GAFP transistors, custom routing of the intra- and/or inter-PCell connections may be required when the GAFP transistors are used. In some scenarios (e.g., low voltage logic circuits), custom and circuitous metal routing may not be feasible due to the high cost of layout resources (person-hours) and inconsistency in available routing lanes. That is, the loss of routing lanes can mean greater expenses with respect to engineering resources (e.g., many existing circuits would require layout modifications) and a larger die size for the memory device. In addition, switching to conventional GAFPs prohibits retrofit to existing designs that utilize the routing lanes over the gate area. Thus, in covenantal devices, multiple steps may be needed to implant the required dopant concentration for each different type of transistor and/or the routing options for metal connections may be limited (e.g., options may be limited to trench isolation regions between transistors for the metal routing). Accordingly, a GAFP transistor that includes predetermined routing lanes and has a similar footprint as standard PCell is desirable.

Embodiments of the present technology are directed to a GAFP transistor that includes predetermined routing lanes over the gate and, in some embodiments, has a footprint that is the same as that of a standard PCell. A memory device can include a substrate and a transistor disposed on the substrate. The transistor can include a gate disposed between a source area and a drain area of the transistor. The transistor can also include a plurality of routing lanes above the gate for use by automated place and route tools that layout metal connections for the memory device. A first field plate can be disposed above a LDD region of the source area with the first field plate being on a same level as the plurality of routing lanes. A second field plate can be disposed above a LDD region of the drain area with the second field plate being on the same level as the plurality of routing lanes. The first and second field plates can be electrically connected to the gate using respective first and second path that bypass the plurality of routing lanes. That is, the electrical connection path between the field plate to the gate does not interfere with the routing lanes over the gate.

In another exemplary embodiment, a method of forming a device can include depositing a gate layer beyond an edge of an active area a transistor to form a gate layer extension. The method can also include depositing at least one of a polysilicon layer or a WSi$_x$ layer extending from the gate layer extension in a region outside the active area to form a first tab connection. The method can further include depositing at least one of a polysilicon layer or a WSi$_x$ layer extending from the gate layer extension on an opposite side of the gate layer in the region outside the active area to form a second tab connection. The method can include depositing a first field plate above a lightly doped region on a source side of the transistor with the first field plate extending over the first tab connection and overlapping the first tab connection as viewed from the top. The method can also include depositing a second field plate above a lightly doped region on a drain side of the transistor with the second field plate extending over the second tab connection and overlapping the second tab connection as viewed from the top. The method can further include connecting the first field plate to the first tab connection to electrically connect the first field plate to the gate and connecting the second field plate to the second tab connection to electrically connect the second field plate to the gate. By connecting the field plates to tab connections located outside the active area, the electrical connection path between the field plate to the gate bypasses (e.g., does not interfere with) the routing lanes over the gate.

Figure 2A:
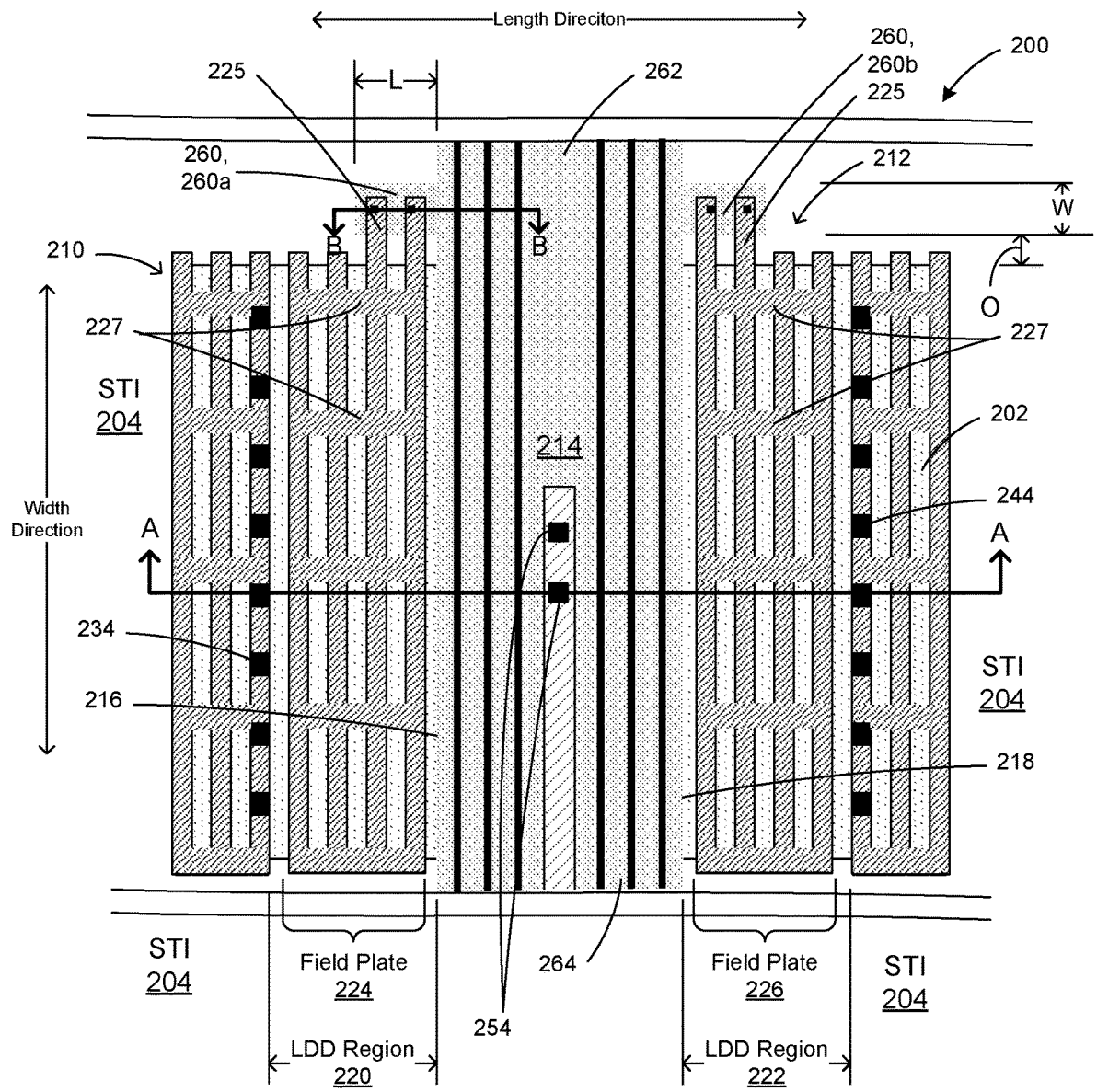

FIGS. 2A and 2B illustrate simplified top and cross-sectional views of an exemplary embodiment of a GAFP transistor 200 (e.g., a high voltage transistor) that can be used in a device (e.g., a memory device and/or another electronic device). The GAFP transistor 200 can be a PCell that includes routing lanes (e.g., predetermined routing lanes) over the gate for metal connections within the PCell and/or between PCells. Although only one transistor is illustrated in FIGS. 2A and 2B, the device can have one or more transistors 200. The transistor 200 can be formed on a substrate 205, which can be composed of silicon. In addition, although the transistor 200 is described herein as being formed or disposed on the substrate 205, those skilled in the art understand that portions of the transistor 200 can be formed in the substrate 205 and portions of the transistor 200 can be formed on the substrate 205. In the example of FIGS. 2A and 2B, the substrate 205 can be a p-type substrate, but in other embodiments, the substrate can be an n-type substrate. The type of substrate can depend on the type of transistor (e.g., NMOS or PMOS). For clarity, an NMOS transistor is discussed but embodiments of the present disclosure can also be applicable to PMOS transistor technology.

The transistor 200 includes an active area 202 surrounded by a shallow-trench isolation (STI) 204 that can be composed of, for example, silicon dioxide. The transistor 200 includes a drain 210, a source 212, and a gate 214. The transistor 200 can include LDD region 220 that is formed between the contacts 234 of drain 210 and the nearest edge 216 of the gate 214. Similarly, the LDD region 222 can be formed between the contacts 244 of source 212 and the nearest edge 218 of the gate 214. A field plate 224 can be formed in a metal layer above the LDD region 220, and field plate 226 can be formed in a metal layer above the LDD region 222. In addition, in some embodiments, the transistor 200 can include secondary field plates over the contact-to-active area edge regions of the source and drain and can be connected to the respective drain and source contact(s). For clarity, unless specifically referring to secondary field plates, "field plate" refers to the field plate over an LDD region of the transistor 200. Field plates 224 and/or 226 can be composed of one or more metals or alloys (e.g., tungsten, $WSi_x$, copper, any combination thereof, and/or another appropriate metal or alloy). In some embodiments, the field plates 224 and/or 226 can be configured in a grid pattern with columns 225 (e.g., along a width direction) and rows 227 (e.g., along a length direction). As used herein, "length direction" means the drain-to-source direction, and "width direction" means a direction that is perpendicular to the "length direction" on a plane parallel to a top surface of the substrate. In addition, "top view" means a view looking at the top surface of the substrate. In some embodiments, the field plates 224 and/or 226 can be formed in a first metal layer adjacent the respective LDD regions. In some embodiments, field plates 224 and/or 226 can be formed in the metal layer used for routing lanes over the LDD regions of a PCell. The columns 225 and/or rows 227 can correspond to the routing lanes of a PCell, for example.

The gate 214 can be comprised of one or more layers of polysilicon and/or WSix (tungsten silicide) and/or some other appropriate material that are disposed on top of the gate oxide 242. One or more metal layers (e.g., a tungsten layers) can be disposed on the gate 214 to serve as an input contact 254 to the transistor 200. In some embodiments, one or more layers of gate 214 can be deposited so as to extend beyond (outside) one or both edges of the active area 202 in the width direction (hereinafter the one or more gate layers disposed outside the active area are referred to as "gate layer extension"). For example, one or more layers of the same material used to form the gate 214 (e.g., polysilicon and/or WSix and/or some other appropriate material) can be deposited outside the respective edges of the active area 202 in a width direction to form gate layer extensions 262 and/or 264. In some embodiments, where multiple transistors are formed, the gate layer extensions 262 and/or 264 can be the deposited gate layers between gates of adjacent transistors. In some embodiments of the present disclosure, one or more layers of the same material used to form the gate layer extensions 262 and/or 264 (e.g., polysilicon and/or WSix and/or some other appropriate material) can be deposited in a direction that extends laterally (e.g., in a length direction) from the appropriate gate layer extension 262 and/or 264 to form a tab connection 260. In other embodiments, the tab connections 260 can be formed from materials other than those used to form the gate layer extensions. In some embodiments, one or more tab connections 260 can be formed on one side or on opposite sides of one or both gate layer extensions 262 and 264. For example, as seen in FIG. 2A, tab connections 260a and 260b can be formed on opposite sides of gate layer extension 252. In some embodiments, only one tab connection 260a or 260b can be formed. In some embodiments, alternatively, or in addition to tab connections 260a and/or 260b, one or more tab connections 260 can be formed on one or opposite sides of gate layer extension 264.

In some embodiments, a length L of tab connection 260, as measured in the length direction from the gate 214 to the farthest end of the tab connection 260, can be in a range of 200 nm to 300 nm such as, for example, 250 nm for each contact (e.g., via 265) between the field plates 224, 226 and the respective tab connections 260a, 260b. For example, if there are two connections (e.g., vias 265), the length L can be in a range of 400 nm to 600 nm, such as, e.g., 500 nm. In some embodiments, the tab connection 260 can have width W that is in a range of a range of 100 nm to 300 nm, such as, for example, 250 nm. The tab connection 260 can be offset in the width direction from a nearest edge of the active area 202 an offset distance O that can be greater than or equal to 10 nm such as, for example, in a range of 10 nm to 120 nm, depending on the application. For low voltage circuits, the offset distance O can be in a range of 10 nm to 90 nm, such as for example, 40 nm to 60 nm. However, for high voltage transistors and modules, the offset distance O can be in a range of 40 nm to 120 nm such as, for example, 80 nm. The offset distance O can be a predetermined minimum distance between the active area and the tab connection 260 based on the breakdown voltage rating of the silicon dioxide in the gap between the active area edge and the tab connection. For example, the offset distance O can be set such that silicon dioxide in the gap between the active area edge and the tan connection can withstand a voltage on tab connection 260 that is up to 30 V. Of course, depending on the application, the voltage on tab connection 260 can be higher or lower and the offset distance O can be set appropriately.

In some embodiments, a portion or all of one or more field plates can extend to one or more tab connections such that there is an overlap with respect to a top view. In some embodiments, the overlap can be in a range of 100 nm to 300 nm, such as, for example 250 nm. For example, in some embodiments, one or more columns 225 of one or both field plates 224 and 226 can extend beyond (outside) the respective edge of active area 202 to overlap, with respect to a top view, with one or more tab connections 260. In the example of FIG. 2A, two columns 225 of field plate 224 extend beyond the edge of active area 202 to overlap with tab connection 260a, and two columns 225 of field plate 226 extend beyond the edge of active area 202 to overlap with tab connection 260b. In some embodiments, the overlap between the columns 225 and tab connections 260 can be such that one or more vias 265 (see FIGS. 2C and 2D) can be formed in the extended portion of the columns 225 to electrically connect the field plates 224 and/or 226 to the respective tab connections 260a, 260b. Because tab connections 260 connect to gate layer extensions 262 and/or 264, which connect to gate 214, the field plates 224 and/or 226 will also be electrically connected to the gate 214 and thus to the one or more gate contacts 254. In addition, because the connections are formed away from the gate 214, the routing lanes 280 above the gate 214 remain available for the automated place and route to layout metal connections for intra- and/or inter-PCell connections. Moreover, because the transistor 200 is only extended slightly in this embodiment, the GAFP transistor 200 can still conform to a standard PCell layout.

The gate 214 can be comprised of one or more layers of polysilicon and/or $WSi_x$ (tungsten silicide) and/or some other appropriate material that are disposed on top of the gate oxide 242. One or more metal layers (e.g., a tungsten layers) can be disposed on the gate 214 to serve as an input contact 254 to the transistor 200. In some embodiments, one or more layers of gate 214 can be FIG. 2B shows a cross-sectional view along section A-A (see FIG. 2A) of transistor 200. As seen in FIG. 2B, NMOS transistor 200 is deposited on the p-type substrate 205. The drain 210 of the NMOS transistor 200 is defined by an n+ diffusion layer 236, and the source 212 of the NMOS transistor 200 is defined by an n+ diffusion layer 246. One or more metal layers (e.g., a tungsten layers) can be disposed on the drain 210 to create one or more drain contacts 234, and one or more metal layers (e.g., a tungsten layers) can be disposed on the source 212 to create one or more source contacts 244. In some embodiments, a channel 240 can be disposed under the gate 214. At least a portion of channel 240 can be doped to have a different (e.g., higher) conductivity than that of the p-type substrate 205 such that the channel 240 will have a desired threshold voltage (Vt). A gate oxide layer 242 can be disposed between the gate 214 and the substrate 205. In some embodiments, the gate oxide layer 242 under the gate 214 (e.g., channel region) can be a relatively thin layer with a thickness of the gate oxide being in a range of 10 Å to 80 Å such as, for example, about 70 Å. In other embodiments, the gate oxide under the gate 214 (e.g., channel region) can be relatively thick with a thickness of the gate oxide being in a range of 200 Å to 500 Å such as, for example, 400 Å.

As discussed above, LDD region 220 can be formed between the drain contact(s) 234 and the edge of gate 214 using an appropriate implant dose concentration. Similarly, LDD region 222 can be formed between the source contact(s) 244 and the edge of gate 214 using an appropriate implant dose concentration. For example, the LDD regions 220 and 222 can be lightly doped to form lower conductivity regions in comparison to the more heavily doped high conductivity n+ regions of the source 212 and drain 210. In some embodiments, the implanted doses in LDD regions 220 and 222 are the same (e.g., within manufacturing tolerances), and in other embodiments, the implanted doses can be different.

FIG. 2C shows a cross-sectional view along section B-B (see FIG. 2A) of transistor 200 and includes the gate layer extension 262 and the tab connection 260a. As seen in FIG. 2C, a layer of gate oxide is deposited above substrate 205. In some embodiments, when the layer(s) for gate 214 are deposited, one or more layers for the gate layer extension 262 can be deposited at the same time (or at a different point in the deposition process). In some embodiments, the number and composition of the deposited layers for gate layer extension 262 are the same as those for the gate 214. In other embodiments the number and/or composition can be different from that of gate 214. In the embodiment of FIG. 2C, the gate layer extension 262 is composed of polysilicon and/or $WSi_x$. A cross-section of the metal routing lanes 280 is shown above the gate layer extension 262.

As seen in FIG. 2C, a dotted line separates the gate layer extension 262 from the tab connection 260a. The tab connection 260a can be formed by extending one or more deposited layers of the gate layer extension 262. In some embodiments, the number and composition of the deposited layers for tab connection 260a are the same as those for gate layer extension 262. In other embodiments the number and/or composition can be different from that of gate layer extension 262. In FIG. 2C, all the layers that make up the gate layer extension 262 are also used to make up tab connection 260a. Thus, the tab connection 262 can also be composed of a same polysilicon and/or $WSi_x$ layer combination as the gate layer extension 262. FIG. 2C also shows the cross-section of field plate columns 225 that extend over and overlap with the tab connection 260a. One or more metal vias 265 can be formed between columns 225 and tab connection 260a to provide an electrical connection between the field plate 224 and the tab connection 260a. Of course, field plate 226 and tab connection 260b can be connected in a similar way using vias. As seen in FIG. 2C, the electrical connection path between the field plate 224 (and field plate 226) and the gate layer extension 262, which connects to gate 214, does not cross or otherwise interfere with the routing lanes 280. That is, unlike conventional GAFP transistors, the connection path between the field plate and gate bypasses the predetermined routing lanes for metal connections.

FIG. 2D illustrates another embodiment of the present disclosure. The embodiment of FIG. 2D is similar to that of FIG. 2C and thus, for brevity, discussions of certain similar components are omitted. In the embodiment of FIG. 2D, the number and/or composition of the deposited layers for tab connection 260a are not the same as those for gate layer extension 262. That is, depending on the electrical properties of the transistor 200, the tab connection 260 can have a different number of layers and/or layers with different compositions than the late layer extensions 262, 264. For example, as seen in FIG. 2D, the gate layer extension 262 is composed of polysilicon layer with a $WSi_x$ disposed over the polysilicon layer. However, when the tab connection 260a is formed, only the $WSi_x$ layer is deposited for this embodiment. In other embodiments, only the polysilicon can be deposited.

Figure 3A:
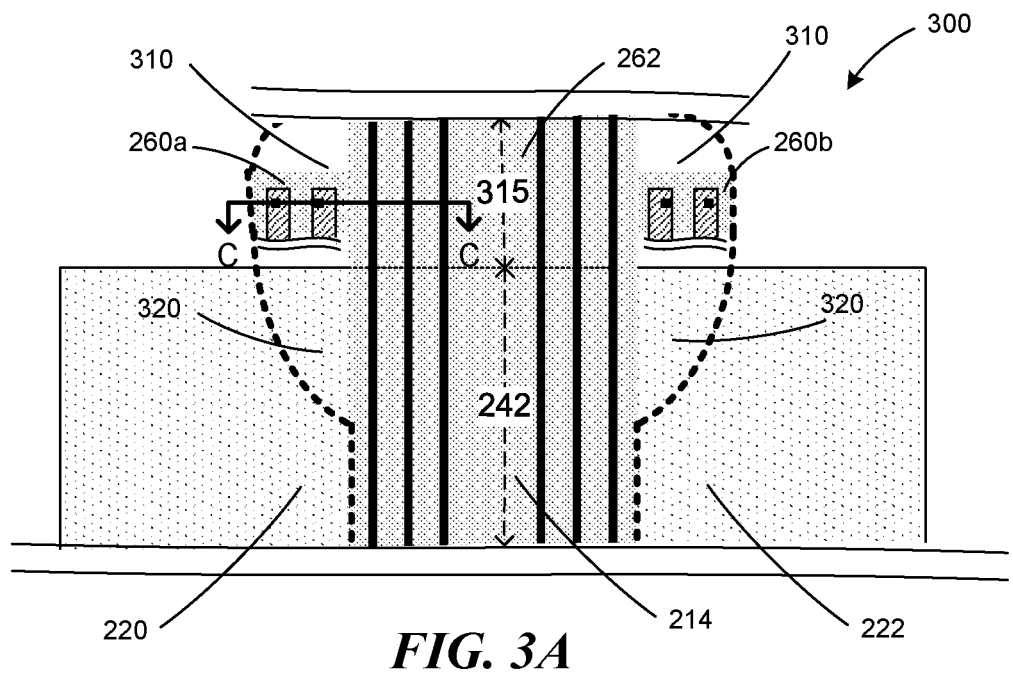
FIGS. 3A and 3B illustrates partial top plan views of other embodiments of a GAFP transistor in accordance with the present disclosure.

As discussed above, in some embodiments, the gate oxide layer 242 under the gate 214 can be a thick oxide layer (e.g., in a range from 200 Å to 500 Å). In some embodiments of the present disclosure, the thick oxide layer can extend to the tab connection regions. The embodiment shown in FIGS. 3A and 3B can be similar to that of FIG. 2A and thus, for brevity, only a portion of the transistor 300 is shown and discussions of certain similar components are omitted. In addition, in FIG. 3A the field plates are removed for clarity. As seen in FIG. 3A, the dotted line can represent a profile of a layer of thick oxide that is deposited prior to the layers composing the gate 214, the gate layer extensions 262 and/or 264, and/or tab connections 260 (see FIG. 2A). In some embodiments, the thick oxide layer can include the gate oxide layer 242 as discussed above. In some embodiments, the thick oxide layer can include a thick extension oxide layer 315 that is deposited under one both gate later extensions 262, 264. In some embodiments, the thick oxide layer can include and a thick tab oxide layer 310 that is deposited at least under one or more tab connections 260. In some embodiments, the thick oxide layer can be deposited under the tab connections 260 while the gate oxide layer 242 and/or the oxide layer under the gate layer extensions 262 and/or 264 can be thin oxide layers. In some embodiments, a thick oxide layer can be deposited at least partially over one or both the LDD regions prior to the gate layer extensions and/or the tab connections to provide a transition region for the thick oxide layer. As seen in FIG. 3A, in some embodiments, thick LDD oxide layer 320 can be deposited at least partially over one or both LDD regions 220 and 222 (see FIG. 2B). The thick LDD oxide layer 320 can extend into the thick tab oxide layer 310 for one or more tab connections 260. Similarly, in some embodiments, a thick gate oxide layer 242 can extend into the thick extension oxide layer 315 for one or both gate layer extensions 262, 264.

Figure 3B:
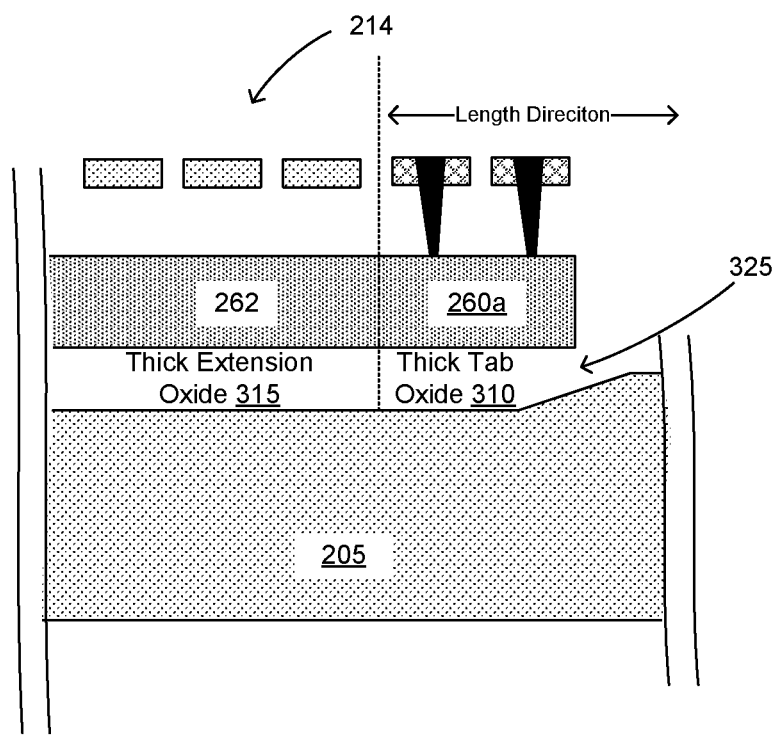

FIG. 3B shows a cross-sectional view along section C-C (see FIG. 3A) of tab connection 260a and a portion of the gate layer extension 262 (a dotted line separates these two components). The embodiment in FIG. 3B is similar to those discussed above and thus, for clarity brevity, certain components are not shown and/or discussions of certain similar components are omitted. As seen in FIG. 3B, a thick extension oxide layer 315 is deposited prior to the deposition of the gate layer extension 262 and/or a thick tab oxide layer 310 is deposited prior to the deposition of the tab connection 260a. A thickness of the extension oxide layer 315 and/or the tab oxide layer 310 can be in a range from 200 Å to 500 Å, such as for example, 400 Å. In some embodiments, the tab oxide layer 310 can transition from a relatively thick oxide layer (e.g., in a range from 200 Å to 500 Å) to a relatively think oxide layer (e.g., in a range of 10 Å to 80 Å) near the outer edge 325 of the tab connection 260a in the length direction. In some embodiments, the thicknesses of the respective oxide layers 310, 315, and 214 are the same. In other embodiments, one or all of the thicknesses of oxide layers 310, 315, and 214 can be different from the other oxide layers. For example, a thickness of tab oxide layer 310 can be relatively thick (e.g., in a range from 200 Å to 500 Å) while a thickness of the extension oxide layer 315 is relatively thin (e.g., in a range of 10 Å to 80 Å). Alternatively, or in addition, a thickness of the gate oxide 242 can be relatively thin (e.g., in a range of 10 Å to 80 Å) while the thicknesses of the tab oxide layer 310 and/or the extension oxide layer 315 can be relatively thick (e.g., in a range from 200 Å to 500 Å). In some embodiments (not shown), the silicon dioxide forming a thick oxide layer (e.g., in a range from 200 Å to 500 Å) under the gate 214 can extend into the LDD regions 220 and 222 and then transition to a thin oxide layer (e.g., in a range of 10 Å to 80 Å) near the respective drain contact(s) 234 and source contact(s) 244.

Figure 4:
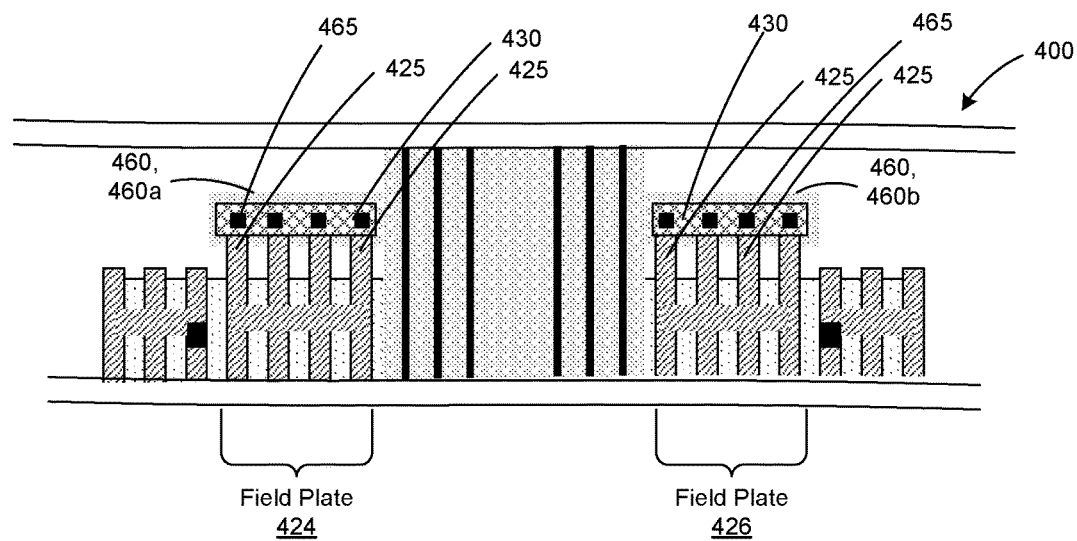
FIGS. 4 and 5 illustrate partial top plan views of other embodiments of a GAFP transistor in accordance with the present disclosure.

FIG. 4 shown another embodiment of a GAFP transistor in accordance with the present disclosure. The GAFP transistor 400 of FIG. 4 is similar to those discussed above and thus, for clarity brevity, certain components are not shown and/or discussions of certain similar components are omitted. In the embodiment of FIG. 2A, the columns 225 of the field plate 224, 226 are directly connected to the respective tab connections 260a and 260b using vias. In addition, in the embodiment of FIG. 2A, the number of connections between the field plate 224, 226 and the respective tab connections 260a and 260b were limited because the tab connection 260 did not extend a full length of the field plate. However, if a greater number and/or more reliable connections are desired (e.g., based on electrical characteristics such as resistance, capacitance, etc.), as shown in FIG. 4, tab connection 460 can be extended further in the length direction to accommodate more connections from field plate 424, 426. For example, as seen in FIG. 4, in some embodiments, the tab connections 460a, 460b can be extended in the length direction up to an end of the respective LDD region at the corresponding drain/source contact(s). That is, the length of tab connection can extend a full length of the field plate in the length direction. In comparison to tab connection 260, the extended length of tab connection 460 allows for more of the field plate 424 and/or 426 to be extended to and overlap with the tab connections 460. For example, in the embodiment of FIG. 4, addition column 425 (e.g., all the columns) of field plate 424 and/or 426 can be extended to and overlap with the tab connections 460.

In addition, in some embodiments, alternatively or in addition to vias, a connection plate 430 can connect to the extended portions of field plate 424 and/or 426 (e.g., connect to the columns of the field plates) to ensure a good connection between the field plate 424 and/or 426 and the respective tab connection 460a and/or 460b. The connection plate 430 can be made of a metal or alloy such as, for example, tungsten, copper, WSi$_x$, or some other appropriate metal or alloy. In some embodiments, the connection plate 430 can be built up from a surface of the tab connection 460 to the field plate layer so that, when the field plate is extended, an electrical connection is made without the use of vias. In other embodiments, the connection plate 430 can connect to the corresponding field plate 424 and/or 426 using vias 465. In some embodiments, the connection plate 430 can be formed on a same level as the field plates, on a level above the field plates, and/or on a level below the field plates.

Figure 5:
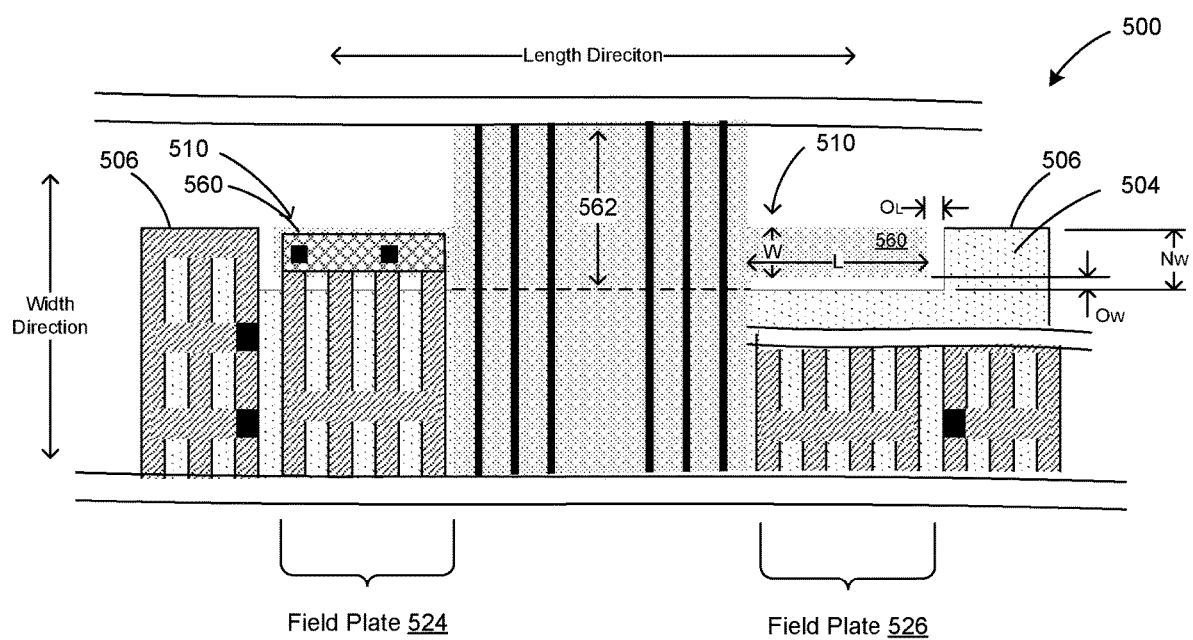

FIG. 5 illustrates another embodiment of a GAFP transistor in accordance with the present disclosure. The GAFP transistor 500 of FIG. 5 is similar to those discussed above and thus, for clarity brevity, certain components are not shown and/or discussions of certain similar components are omitted. In GAFP 500, the tab connections 560, including the composition and connections to field plates 524 and/or 526, can be similar to any of the tab connections in the embodiments discussed above. Similar to the above embodiments, the tab connection 560 can extend from a gate layer extension such as, for example, gate layer extension 562 as shown in FIG. 5. However, instead of the tab connection 560 being formed in an area outside the outermost edge of the active area in a width direction as in the above embodiments, at least a portion of the tab connections 560 are formed within the outermost edge of the active area 504 in a width direction. For example, as seen in FIG. 5, the source side and/or the drain side of the transistor can include areas in one or both the LLD regions that are separate from the active area 504 but within the outermost edge of the active area 504 (referred to herein as "notch"). For example, as seen in FIG. 5, the tab connections 560 are in notch 510, which is separate from the active area 504 but within the outermost edge of the active area 504. One or more notches 510 can be formed along the edges of the gate layers on the drain and/or source sides. For example, the notch 510 can be formed by masking the desired area in the LDD region so that the implant dose for the corresponding LDD region is not deposited in the notch area. In the embodiment of FIG. 5, the gate layers adjacent to the notch 510 form at least part of the gate later extension 562. In the embodiment of FIG. 5, two notches 510 are formed at the end of the gate in the width direction. The notches 510 are formed within the outermost edge 506 of the active area 504 in the width direction. For clarity, portions of the field plate 526 and the secondary field plate have been removed to better see the notch 510 in the source side of the active area 504. A similar notch 510 can be formed in the drain side of the active area 504. In the embodiment of FIG. 5, the notch 510 has a notch width $N_W$ that is equal to or greater than the width W of the tab connection 560 plus an offset $O_W$ from the active area 504 in the width direction. In addition, the notch 510 has a notch length NL that is equal to or greater than the Length L of the tab connection 560 plus an offset $O_L$ from the active area 504 in the width direction. Similar to offset O discussed above, the offsets $O_L$ and $O_W$ can be respective predetermined minimum distances between the active area 504 and the tab connection 560 based on the breakdown voltage rating of the silicon dioxide in the gap.

As seen in FIG. 5, one or more tab connections 560 can extend from gate layer extension 562. Although FIG. 5 only shows one gate layer extension, a similar gate layer extension can be formed on the other side of the transistor 500. The formation and configuration of the gate layer extensions and the tab connections can be similar to the embodiments discussed above and thus, for brevity, will not be repeated. In the above embodiment, the outer edge of the tab connection 560 in the width direction is set to be at or within an outermost edge of the active area 504 in the width direction. That is, an entirety of the tab connection 560 is at or within the outermost edge 506 of the active area 504 in the width direction. However, in other embodiments the dimensions of the notch 510 are such that only a portion of the tab connection 560 is within the outermost edge 506 of the notch 510 in the width direction. In this embodiment, because at least a portion of the tab connection can be formed within a notched area of the active area, the size or footprint of the GAFP transistor can be the same as a PCell for a conventional GAFP transistor.

Because the exemplary embodiments of a GAFP transistor as discussed above still include the routing lanes (e.g., predetermined routing lanes) above the gate region of the transistor, the above exemplary embodiments can be substituted with DAFP transistors without a loss of metal connection options as in conventional memory devices. The substitution of a DAFP transistor that requires a lower applied dose with a GAFP transistor to minimize the number of implant dose steps is discussed with reference to FIGS. 6A and 6B.

Figure 6A:
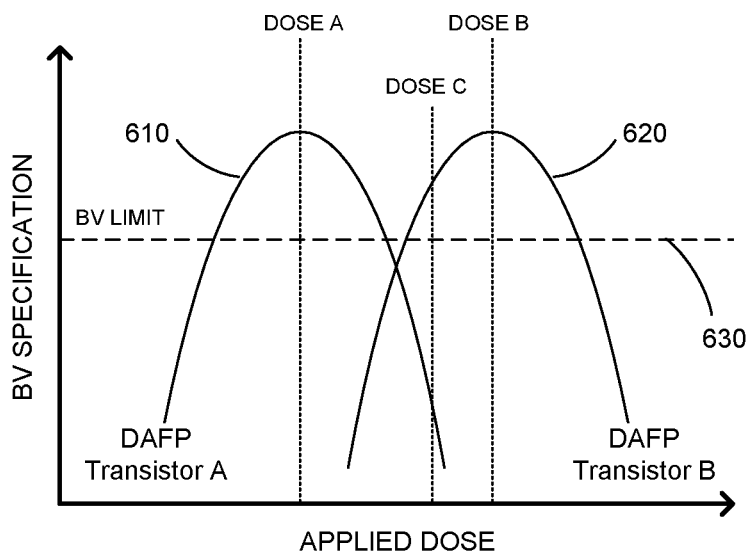
FIGS. 6A and 6B illustrate breakdown voltage curves for an LDD region of different transistors as a function of implant dose concentration.

FIG. 6A shows exemplary BV curves 610 and 620 that respectively show the change in the breakdown voltage (y-axis) of DAFP transistors A and B as the implant dose concentration (x-axis) is increased in the respective LDD regions. The BV curve corresponds to approximately the average implant dose concentration in the breakdown path. DAFP transistors A and B can represent different transistors in a same device or transistors in different devices (e.g., devices formed during a same manufacturing process). The BV limit 630 (dotted line) can represent the acceptable BV limit for the LDD regions of transistors A and B with the BV values that are at or above the BV limit 630 being in an acceptable range. For clarity, the BV limit 630 is shown as being the same for both transistors, but the BV limits of the respective regions can be different in embodiments of the present disclosure. As seen in FIG. 6A, as the applied dose increases for each transistor A and B, the BV of the respective LDD regions (as shown by curves 610 and 620), will vary from an unacceptable BV range (below the BV limit 630) to an acceptable BV range (at or above the BV limit 630) and then back down to an unacceptable BV range. That is, too high or too low of an implanted dose in the LDD region will result in too low of a BV value for the region. The optimal implanted dose for the LDD region of transistor A with respect to BV is at the peak of curve 610, which corresponds to applied dose A, and the optimal implanted dose for the LDD region of transistor B is at the peak of curve 620, which corresponds to applied dose B. However, while applied doses A and B can correspond to the optimal implanted doses for a given LDD region, other applied dose concentrations can also be used so long as the BV values are within the acceptable range for the transistor. That is, applied dose for a transistor need not correspond to the optimal implanted dose but can be within a range of doses that provide an acceptable BV value for the LDD region (referred to as "acceptable applied dose range"). For example, the range of applied doses corresponding to the portion of each curve 610 and 620 that is at or above the BV limit 630 can represent an acceptable applied dose range for the respective LDD regions. Accordingly, in our example, applied dose C, although not at the optimal implanted dose for the LDD region of transistor B, can still be used for the LDD region of transistor B because applied dose C produces a BV value that is above the BV limit 630. However, applied dose C cannot be used for transistor A because it falls outside the acceptable range for transistor A.

Figure 6B:
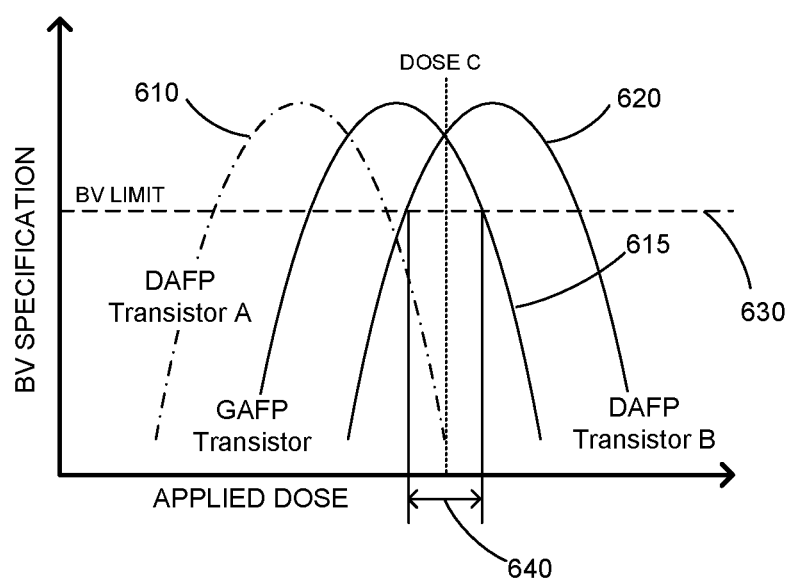

In the example of FIG. 6A, an acceptable applied dose range for DAFP transistor A and an acceptable applied dose range for DAFP transistor B do not overlap. Without an overlap, there is no common acceptable dose that can be shared in the formation of the LDD regions of DAFP transistors A and B that will still satisfy the BV limit for the respective regions. Accordingly, when manufacturing conventional transistors that do not have overlapping acceptable applied dose ranges, separate dopant implant steps will be required along with appropriate masks, which can be uneconomical. To reduce the number of dopant implant steps, a DAFP transistor requiring a lower applied dose (e.g., DAFP transistor A) can be replaced with a GAFP transistor in accordance with an embodiment of the present disclosure. Such a substitution is possible because the effective implant dose concentration in the LDD region of a GAFP transistor after taking into consideration all electrical effects, such as accumulation or depletion from nearby conductors or from internal p-n junction depletion, will be less than that for a DAFP transistor for a same applied implant dose concentration. Thus, a GAFP transistor requires a higher applied dose than the DAFP transistor A to produce a similar acceptable BV characteristic curve. FIG. 6B shows exemplary BV curves for LDD regions of a GAFP transistor and DAFP transistor B. As seen in FIG. 6B, the effect of replacing DAFP transistor A with a GAFP transistor is to allow an overlap in the acceptable applied dose ranges for the GAFP and DAFP B transistors. For example, as seen in FIG. 6B, the BV curve 610 (now shown as a dot-dash line) for DAFP transistor A is longer applicable and replaced by curve 615 for the GAFP transistor. The acceptable applied dose range of GAFP transistor overlaps with the acceptable applied dose range of DAFP transistor B as shown by overlap range 640. The overlap range 640 represents a range of shared applied dose values that can be used in the dopant implant step for the LDD regions of both the GAFP transistor and the DAFP transistor B. For example, dose C can be used as a shared (or common) applied dose for a dopant implant step in the fabrication of the GAFP transistor and the DAFP transistor B. Thus, by substituting a DAFP transistor requiring a lower applied dose with a GAFP transistor in accordance with an embodiment of the present disclosure, not only can the number of implant dose steps can be reduced but there will be routing lanes above the gate that can be used by automated place and route tools for metal connections within and between PCells.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. An apparatus, comprising:
a substrate; and
a transistor disposed on the substrate, the transistor including,
   a gate disposed between a source area and a drain area of the transistor,
   a plurality of routing lanes above the gate for depositing metal connections,
   a first field plate disposed above a lightly doped region (LDD region) of the source area, the first field plate being on a same level as the plurality of routing lanes,
   a second field plate disposed above a LDD region of the drain area, the second field plate being on the same level as the plurality of routing lanes, and
   wherein the first and second field plates are electrically connected to the gate using respective first and second paths that bypass the plurality of routing lanes.

2. The apparatus of claim 1, further comprising:
a first tab connection that is disposed outside an active area of the transistor, the first path including the tab connection, and
a second tab connection that is disposed outside the active area of the transistor, the second path including the second tab connection.

3. The apparatus of claim 2, wherein the first and second field plates are configured to extend over the respective first and second tab connections,
   wherein the first and second field plates are further configured to overlap with the tab connection, and
   wherein the first and second field plates are electrically connected to the respective first and second tab connections.

4. The apparatus of claim 3, wherein the overlap is in a range of 100 nm to 300 nm.

5. The apparatus of claim 2, wherein the first and second tab connections are formed over a thin oxide layer that is in a range of 10 Å to 80 Å.

6. The apparatus of claim 2, wherein the first and second tab connection are formed over a thick oxide layer that is in a range of 200 Å to 500 Å.

7. The apparatus of claim 2, wherein the first and second tab connections are offset from an edge of the active area by a distance in a range of 10 nm to 120 nm.

8. The apparatus of claim 2, wherein the first and second field plates are electrically connected to the respective first and second tab connections using vias.

9. The apparatus of claim 2, wherein the first and second field plates are electrically connected to the respective first and second tab connections using corresponding first and second metal connection plates, and
   wherein the first and second metal connection plates extend over a full length of the respective overlapped portions of the first and second field plates in a length direction.

10. The apparatus of claim 2, further comprising:
a first notch area in the first LDD region that is separate from the active area, the first notch area arranged adjacent the gate such that the first notch area is within an outermost edge of the active area in a width direction of the transistor, and
a second notch area in the second LDD region that is separate from the active area, the second notch area arranged adjacent the gate such that the second notch area is within the outermost edge of the active area in the width direction of the transistor.

11. The apparatus of claim 10, wherein at least a portion of the first and second tab connections are formed within the respective first and second notch areas.

12. The apparatus of claim 1, further comprising:
a gate layer extension that is disposed beyond the edge of an active area and connected to the gate,
wherein the first and second tab connections are connected to opposite sides of the gate layer extension.

13. A method, comprising:
depositing a gate layer beyond an edge of an active area a transistor to form a gate layer extension;
depositing at least one of a polysilicon layer or a WSix layer extending from the gate layer extension in a region outside the active area to form a first tab connection;
depositing at least one of a polysilicon layer or a WSix layer extending from the gate layer extension on an opposite side of the gate layer in the region outside the active area to form a second tab connection;
depositing a first field plate above a lightly doped region (LDD region) on a source side of the transistor, the first field plate extending over the first tab connection and overlapping the first tab connection as viewed from the top;
depositing a second field plate above a LDD region on a drain side of the transistor, the second field plate extending over the second tab connection and overlapping the second tab connection as viewed from the top;
connecting the first field plate to the first tab connection to electrically connect the first field plate to the gate; and
connecting the second field plate to the second tab connection to electrically connect the second field plate to the gate.

14. The method of claim 13, wherein the first and second field plates overlap the respective first and second tab connections, and
wherein the overlap is in a range 100 nm to 300 nm.

15. The method of claim 13, further comprising:
depositing an oxide layer prior to forming the first and second tab connections over the oxide layer,
wherein the oxide layer is in a range of 200 Å to 500 Å.

16. The method of claim 13, wherein the first and second tab connections are offset from the edge of the active area by a distance in a range of 10 nm to 120 nm.

17. The method of claim 13, further comprising:
forming a first notch area in the first LDD region that is separate from the active area, the first notch area arranged adjacent a gate of the transistor such that the first notch area is within an outermost edge of the active area in a width direction of the transistor; and
forming a second notch area in the second LDD region that is separate from the active area, the second notch area arranged adjacent the gate of the transistor such that the second notch area is within the outermost edge of the active area in the width direction of the transistor,
wherein at least a portion of the first and second tab connections are formed within the respective first and second notch areas.

18. An apparatus, comprising:
a substrate;
a transistor disposed on the substrate, the transistor including,
a gate disposed between a source area and a drain area of the transistor,
a first field plate disposed above a lightly doped region (LDD region) of the source area,
a second field plate disposed above a LDD region of the drain area,
a first tab connection that is disposed outside an active area of the transistor, the first field plate configured to extend over the first tab connection and overlap with the first tab connection, the first field plate electrically connected to the first tab connection, and
a second tab connection that is disposed outside the active area of the transistor, the second field plate is configured to extend over the second tab connection and overlap with the second tab connection, the second field plate electrically connected to the second tab connection; and
a gate layer extension that is disposed beyond an edge of the active area and connected to the gate,
wherein the first and second tab connections are connected to opposite sides of the gate layer extension.

19. An apparatus, comprising:
a substrate; and
a transistor disposed on the substrate, the transistor including,
a gate disposed between a source area and a drain area of the transistor,
a first field plate disposed above a lightly doped region (LDD region) of the source area,
a second field plate disposed above a LDD region of the drain area,
a first tab connection that is disposed outside an active area of the transistor, the first field plate configured to extend over the first tab connection and overlap with the first tab connection, the first field plate electrically connected to the first tab connection, and
a second tab connection that is disposed outside the active area of the transistor, the second field plate is configured to extend over the second tab connection and overlap with the second tab connection, the second field plate electrically connected to the second tab connection,
wherein the first and second LDD regions of the transistor have a first acceptable applied dose range for applying an implant dose in the first and second LDD regions,
wherein the apparatus further comprises:
a drain attached field plate (DAFP) transistor disposed on the substrate, the DAFP transistor having at least one third LDD region,
wherein the at least one third LDD region has a second acceptable applied dose range for applying the implant dose, and
wherein the first acceptable dose range at least partially overlaps with the second acceptable dose range.

* * * * *